(12) United States Patent
Ben-Rubi

(10) Patent No.: US 7,969,809 B2
(45) Date of Patent: Jun. 28, 2011

(54) POWER CONSUMPTION-ORIENTED MANAGEMENT OF A STORAGE SYSTEM

(75) Inventor: Refael Ben-Rubi, Rosh Ha'ayin (IL)

(73) Assignee: Sandisk IL Ltd., Kfar Saba (IL)

( * ) Notice: Subject to any disclaimer, the term of this patent is extended or adjusted under 35 U.S.C. 154(b) by 375 days.

(21) Appl. No.: 12/186,409

(22) Filed: Aug. 5, 2008

(65) Prior Publication Data

US 2010/0034042 A1 Feb. 11, 2010

(51) Int. Cl.
*G11C 5/14* (2006.01)
(52) U.S. Cl. ........................................ 365/226; 365/227
(58) Field of Classification Search .................. 365/226, 365/227, 185.28; 713/300
See application file for complete search history.

(56) References Cited

U.S. PATENT DOCUMENTS

| | | | |
|---|---|---|---|
| 5,422,856 A | 6/1995 | Sasaki et al. | |
| 7,082,060 B2 * | 7/2006 | Roohparvar | 365/185.3 |
| 7,177,222 B2 | 2/2007 | Spengler | |
| 7,340,618 B2 * | 3/2008 | Kark et al. | 713/300 |
| 7,412,611 B2 * | 8/2008 | Tipley | 713/300 |
| 2004/0095834 A1 | 5/2004 | Chevallier | |
| 2005/0028014 A1 * | 2/2005 | Allred et al. | 713/300 |
| 2006/0226243 A1 * | 10/2006 | Dariel | 235/492 |
| 2007/0211551 A1 * | 9/2007 | Yogev et al. | 365/226 |

FOREIGN PATENT DOCUMENTS

WO WO 2007/136944 11/2007

* cited by examiner

*Primary Examiner* — Anh Phung
(74) *Attorney, Agent, or Firm* — Beyer Law Group LLP

(57) ABSTRACT

A method of managing operation of a plurality of devices that includes receiving operational information that pertains to each of a plurality of device and managing operation of at least one of the plurality of devices. Each of the plurality of devices is configured to perform operations, the operations including sub-operations. The operation management includes associating parameters for a given sub-operation of a device based on 1) operational information pertaining to at least one of the plurality of devices and on 2) a maximum allowable current consumption level. Also provided is a system that includes a plurality of devices and a controller that is operationally connected to each of the plurality of devices for setting values for parameters of a device for a given sub-operation based on 1) operational information pertaining to at least one of the devices and on 2) a maximum allowable current consumption level of the system.

18 Claims, 6 Drawing Sheets

| Parameters | Time it takes for sub-program operation | Current consumed during sub-operation (program) |
|---|---|---|
| Program w/ 2 pipelines; at 30 MHz frequency | 200 msec | 40 mA |
| Program w/ 4 pipelines; at 30 MHz frequency | 100 msec | 80 mA |
| Program w/ 8 pipelines; at 30 MHz frequency | 50 msec | 160 mA |
| Program w/ 2 pipelines; at 40 MHz frequency | 175 msec | 45 mA |
| Program w/ 4 pipelines; at 40 MHz frequency | 75 msec | 85 mA |
| Program w/ 8 pipelines; at 40 MHz frequency | 45 msec | 150 mA |

FIG. 5

POWER CONSUMPTION-ORIENTED MANAGEMENT OF A STORAGE SYSTEM

FIELD OF THE INVENTION

The present invention relates generally to the management of a plurality of storage devices. More particularly, the present invention relates to a centralized current-oriented management of operations of a plurality of devices.

BACKGROUND

Some storage systems include several storage devices and each storage device may be engaged in one storage operation (e.g., "read", "write", or "erase" operation) or another. Storage operations may occasionally need to be performed simultaneously in two or more storage devices. However, performing storage operations on several storage devices simultaneously is limited by the maximum current that can be provided by the storage system using these storage devices. With two or more storage devices operating simultaneously, sometimes on peak current consumption level, there is a danger that the total current required by these two or more storage devices would exceed the maximum allowable current.

Under such circumstances, the voltage provided to the storage devices from a power supply or from a charge pump will drop below a valid operation level, causing the behavior of the storage devices to be unpredictable. In such a case, if, for example, the last storage operation was programming (i.e., writing) data to one of the storage devices, that data may be corrupted as a result of the undesired decrease in the system's operating voltage.

Briefly, a charge pump, as used in a flash memory, is an electric circuit that generates a relatively high voltage that is used to manipulate the amount of electrical charge within flash memory cells to write new data into these cells, to erase data from memory cells, and to read data from these cells. Being a voltage source, a charge pump is designed to provide an electrical current whose value is permitted to change from zero to some maximal value beyond which the level of the output voltage of the charge pump starts to decrease uncontrollably.

There is, therefore, a need to for a system that can perform multiple operations simultaneously in a controlled manner, without jeopardizing the operating voltage of the storage system.

SUMMARY

In view of the foregoing observations and the present needs, it would be advantageous to have a method and system for managing execution of sub-operations for a plurality of devices.

Embodiments, various examples of which are discussed herein, may include a method of managing operation of a plurality of devices that includes receiving operational information that pertains to each of a plurality of device; and managing operation of at least one of the plurality of devices. Each of the plurality of devices is configured to perform operations, the operations including sub-operations. The operation management including associating parameters for a given sub-operation of a device based on 1) operational information pertaining to at least one of the plurality of devices and on 2) a maximum allowable current consumption level.

The operational information may include current consumption requirements for the parameters per sub-operation. The parameters may include at least one of: number of bits being simultaneously employed in a programming operation, number of voltage steps being used in a programming operation, frequency of a clock being used in an operation, etc.

The setting of the parameters may include causing a device to operate at a first operational state and causing at least one other device to operate at a second operational state, based on the operational information and on the maximum allowable current consumption level. The second operational state corresponds to a command different from that represented by the first operational state. The setting of the parameters may be based also on a priority assigned to at least one of the plurality of devices. As an example, the setting of the parameters may be based also on the content associated with an operation being performed on the at least one device on which the operation is being performed.

The operation management may further include programming of data onto at least one of the plurality of devices, erasing of data from at least one of the plurality of devices, and/or reading of data stored on at least one of the plurality of devices, based on the operational information and on the maximum allowable current consumption level.

Also provided is a method of managing operation of a device that includes providing operational information to a controller, by a device that is configured to perform operations including sub-operations; and performing, by the device, a given sub-operation based on a command received from the controller. The sub-operation is performed based on a maximum allowable current consumption level and on operational information that pertains to 1) the storage device and to 2) at least one other storage device being operationally connected to a controller.

The parameters may include at least one of: number of bits being simultaneously employed in a programming operation, number of voltage steps being used in a programming operation, frequency of a clock being used in an operation, etc.

Also provided is a system that includes a plurality of devices and a controller operationally connected to each of the plurality of devices. Each of the plurality of devices is configured to perform operations, the operations including sub-operations. The controller is operative to manage operation of at least one of the plurality of devices. The operation management includes associating parameters for a given sub-operation of a device based on 1) operational information that pertains to at least one of the plurality of devices and on 2) a maximum allowable current consumption level of the system.

At least one of the plurality of devices may be a storage device, an input-output device, and/or a storage device controller, and may have a configuration in accordance with flash memory technology.

Also provided is a storage device that is operationally connected to a controller, the storage device includes: a storage portion and circuitry operative to manage operation of the storage portion. The storage portion is configured to store data and to perform operations, the operations including sub-operations. The operation management includes providing operational information that pertains to the storage device to a controller, and performing a given sub-operation based on a command received from the controller. The sub-operation is performed based on a maximum allowable current consumption level and on operational information pertaining to 1) the storage device and to 2) at least one other storage device being operationally connected to the controller.

Also provided is a controller for managing a plurality of devices, the controller includes circuitry that is operationally connected to a plurality of devices. Each of the plurality of devices performs operations that include sub-operations. The circuitry being operative to manage operation of at least one of the plurality of devices, and the operation management includes associating parameters for a given sub-operation of a device based on operational information that pertains to the plurality of devices and on a maximum allowable current consumption level.

Additional features and advantages of the embodiments described are possible as will become apparent from the following drawings and description.

BRIEF DESCRIPTION OF THE DRAWINGS

For a better understanding of the various embodiments, reference is made to the accompanying drawings, in which like numerals designate corresponding sections or elements throughout, and in which:

FIG. 5 shows a table stored on a storage device according to another exemplary embodiment;

Figure 1:
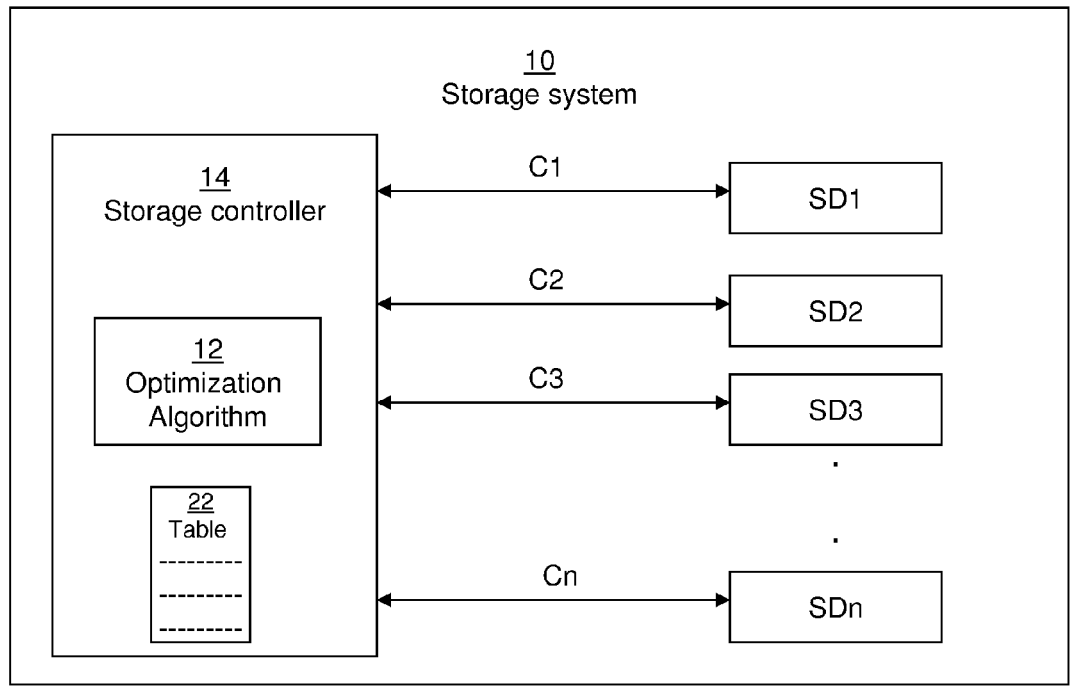
FIG. 1 is a block diagram of a storage system according to one embodiment.

It will be appreciated that for simplicity and clarity of illustration, elements shown in the figures are not necessarily drawn to scale. Further, where considered appropriate, reference numerals may be repeated among the figures to indicate like, corresponding or analogous elements.

DETAILED DESCRIPTION

The embodiments and various aspects thereof are further described in more details below. This description is not intended to limit the scope of claims but instead to provide examples of such embodiments. The following discussion therefore presents exemplary embodiments, which include various systems for managing operation of a plurality of devices, such as storage devices, I/O (input-output) devices, etc. Such systems may be configured in software, firmware, hardware, or any combination thereof.

FIG. 1 is a block diagram of a storage system 10 for managing operation of a plurality of storage devices according to one embodiment. Storage system 10 includes n storage devices designated as SD1, SD2, SD3, . . . , SDn, which may be of the flash memory technology. Each of devices SD1 through SDn performs storage and storage-related operations (referred to hereinafter as "operations" for short) that include sub-operations.

In the context of this description, an "operation" may refer to any storage operation including, for example, a data read and write (program) operations that are performed on a memory page, and a data erase operation that is done on a memory block. A memory page is a physical arrangement of memory cells. A block is a collection of memory pages. A "sub-operation" refers to one stage (or one step or phase), from sequence a stages, that is performed on a memory page or a memory block. Putting all of the sub-operations together, one after another, is considered till now as storage operation (e.g., programming).

For example, transferring/exchanging data between different memory portions/buffers in a storage device; transferring/exchanging data between memory portions/buffers of different storage devices; performing data processing (performing error detection, for example), are all regarded as a sub-operation. Verifying that an operation on a storage device is or has terminated is another exemplary sub-operation.

Storage system 10 also includes a storage controller 14 that is operatively connected to storage devices SD1 through SDn for managing data transfers into and from each of storage devices SD1 through SDn. Depending on the configuration of storage system 10 a storage device may be directly or indirectly connected to one or more of the other storage devices SDi. For example, storage device SD1 may be directly or indirectly (i.e., via storage controller 14) connected to SD2, or to SD2 and SD4, or to SDn, etc.

Storage controller 14 controls the way that sub-operations are performed on the storage devices SD1 through SDn in a way that optimizes the overall performance of storage system 10. Storage controller 14 may simultaneously manage more than one storage device SDi. Optimizing overall system performance of a storage system refers herein in terms of obtaining optimal data transfer rate from the host to the memory array (or from the memory array to the host) under the limitation of the maximum allowable current consumption level of the storage system. This may be achieved by storage controller 14 running an algorithm (implemented in software, firmware and/or hardware) that determines when to activate each storage device and with which parameters.

In order to facilitate management of storage devices SD1 through SDn by storage controller 14, operational information is exchanged either continually, occasionally, or intermittently between storage devices SD1, SD2, SD3, . . . , SDn and storage controller 14 over or via data and control lines C1, C2, C3, . . . , Cn, respectively. Operational information originating from a storage device as such may include a unique storage device identifier that identifies the storage device to storage controller 14. The operational information of each storage device may be provided to storage controller 14 by the storage devices themselves. Alternatively or additionally, the operational information may be embedded in storage controller 14 during manufacturing thereof.

In the context of this description, "operational information" of a device (such as storage device SD1) includes current consumption requirements per given sub-operation. In the context of the disclosure, "information" and "operational information" may include any real time information that is dynamically updated (i.e., by a storage controller or by a storage device) over time, and/or information indicating or related to fixed or predefined requirements.

Storage controller 14 may access the operational information pertaining to storage devices SD1 through SDn in various ways, depending on where the operational information resides. For example, the operational information may be stored on storage controller 14, for example in table 22. Storage controller 14 may receive the operational information from storage devices SD1 through SDn in response to an information request that is issued by storage controller 14.

Storage controller 14 receives the operational information from storage devices SD1 through SDn and employs an optimization algorithm 12, which typically resides on storage controller 14. Optimization algorithm 12 sets parameters to sub-operations of a storage device in order to optimize the overall performance of storage system 14. Setting the parameters by optimization algorithm 12 determines the way storage controller 14 controls sub-operations that are performed by a storage device. The parameters set by optimization algorithm 12 may be stored on a table such as table 22. Exemplary parameters for controlling sub-operations that are performed on storage devices SD1, SD2, and SD3 are shown in more detail in table 22 in FIG. 4.

"Parameters" refer herein to a set of properties that can be associated with a storage device to thereby cause the storage device to function in a specific way. Note that associating storage devices different parameters may cause the storage devices to function in different ways; while associating storage devices the same parameters may cause the devices to function in the same way, according to the configuration.

Non-limiting examples for such parameters may be the number of bits simultaneously programmed in a programming operation and/or the number of voltage steps being used by the storage device in a programming operation. A voltage step defines the pulse width and repetition frequency of a particular operation, e.g., the more voltage steps used in a programming operation, the more reliable is the result of the programming operation. Another parameter may be the frequency of the clock that is used by the storage device in an operation.

With the setting of parameters for different sub-operations, storage controller 14 may issue different commands to different storage devices at a given, or at consecutive points in time. This may cause storage devices to simultaneously operate in different ways, while ensuring that the total amount of electrical current that is collectively consumed at any given time by all the storage devices SD1 through SDn does not exceed a maximum operational value beyond which reliable operation of storage system 10 cannot be ensured or guaranteed.

For example, storage controller 14 may prompt storage device SD1 to operate at a first operational state, for example by instructing SD1 to perform a program operation with its internal clock set to 30 MHz frequency, while causing storage devices SD2 and SD3, for example, to operate at a second operational state, by instructing SD2 and SD3 to perform a program operation with its internal clock set to 50 MHz frequency for example. By setting the parameters as such it is guaranteed that the total current that is consumed by storage devices SD1, SD2 and SD3 during the simultaneous programming does not exceed the maximum allowable current consumption level of storage system 10.

The parameters set by optimization algorithm 12 are set based on operational information pertaining to storage devices SD1 through SDn, and also based on current consumption restrictions of storage system 10 as a whole.

Each of storage devices SD1 through SDn performs sub-operations according to a command or commands that the storage device receives from storage controller 14. That is, a command received by the storage device specifies to the storage device how to perform sub-operation one or more. In other words, before the storage device performs the next sub-operation the storage device waits for storage controller 14 to send a command that specifies to the storage device how to perform the next sub-operation (as is demonstrated in FIG. 3, for example).

Thus, storage controller 14 programs data onto storage devices SD1 through SDn, erases data from storage devices SD1 through SDn, and/or reads data stored on storage devices SD1 through SDn, based on operational information received and on the maximum allowable current level that storage system 10 can consume.

The maximum allowable current consumption level of storage system 10 can be predetermined, for example during manufacture of storage system 10, or it can be determined by a host that communicates with the storage devices.

Optimization algorithm 12 may set different parameters for different sub-operations of a particular storage device. Optimization algorithm 12 may set different parameters for different storage devices performing the same type of sub-operation. Parameters may be set by optimization algorithm 12 for every sub-operation or only for selected sub-operations.

The data management employed by the storage controller 14 may factor in priority considerations. In such case, storage controller 14 is operable to set the values for corresponding parameters of a storage device based also on a priority that is assigned to the particular storage device.

A state in which one storage device has a higher priority over another storage device may result from an urgent need of first storage device to operate at a high current consumption level and/or at an immediate point in time. Under such circumstances, storage controller 14 may render one storage device longer (i.e., extended), and/or more frequent, current consumption periods over another storage device.

Storage devices SD1 through SDn may be prioritized based on one or more criteria selected from the group of criteria including, but not limited to, the type of content that is transferred to a particular storage device at a certain time, the specific storage device configuration, the placement of the particular storage device in the storage system, etc.

For example, storage controller 14 can determine to assign a high priority level to a particular storage device and to apply that priority when a certain type of information (e.g., secured content, BOOT information, information associated with the operating system, or any other important or operationally, or otherwise, critical user or system information) is to be transmitted to that storage device.

According to another example, storage controller 14 can assign a low priority to the upper-most located storage device in the storage system 10, since this storage device is exposed to radiation and/or to mechanical stress more than the other storage devices in the storage system 10 and as a result tends to malfunction more quickly.

According to yet another example, the storage controller 14 may assign a particular storage a low priority when this storage device is busy with another operation and does not need to consume high level of current (and/or long time periods of high current consumption), when this storage device does not support the specific protocol between state machine and/or any of the other storage devices and/or when a storage device becomes bad and malfunctions, etc. Alternatively, the storage controller 14 may assign a particular storage a high priority when this storage device is operating in sleep mode or idle mode.

Prioritization of storage devices may be based on additional one or more criteria, or on alternative criteria. For example, the storage controller 14 may assign a storage device low priority level when the storage device is busy executing an operation that does not require high current or long time periods of high current consumption. According to another example, the storage controller 14 assigns a storage device low priority level when this storage device does not support the specific protocol with the controller and/or with any of the other storage devices, when a storage device becomes bad and malfunctions, etc. Also, the controller 14 may assign a storage device a low priority level when the storage device is operating in sleep mode or in idle mode.

Note that the manner in which storage controller 14 sets values for parameters for a given sub-operation may vary from one storage system to another and from one point in time to another on the same storage system. Also note that storage controller 14 may be provided with additional storage device management capabilities known to those skilled in the art, such as wear-leveling management, error correction code ("ECC") management, bad bock management, and data transfer management.

Typically, storage devices SD1 through SDn are similar or identical; i.e., they are configured likewise and, therefore, store data in a similar manner. As a result, storage controller 14 may be operable to set values for parameters for a given sub-operation based on operational information pertaining to only one storage device in the storage system 10. However, storage devices may be configured differently.

In case of malfunction of one of the storage devices in the storage system 10, the storage controller 14 is typically configured to continue to work properly and to manage operation of the remaining storage devices in the storage system according to the way described above.

Figure 2:
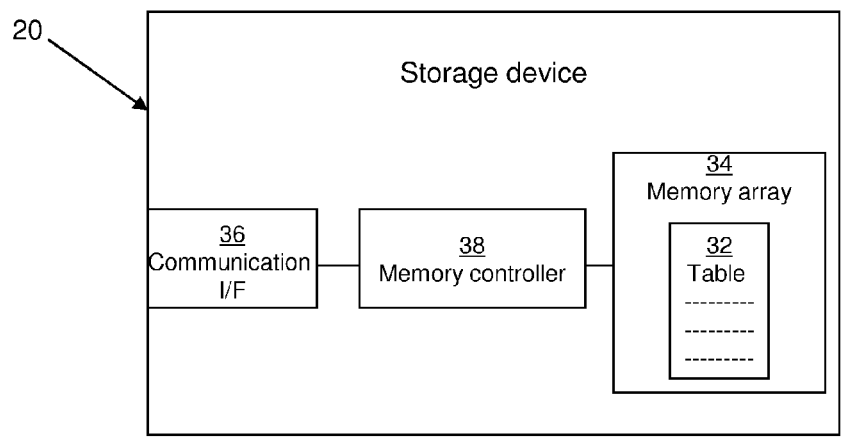
FIG. 2 shows a storage device, according to one embodiment.

FIG. 2 shows a storage device 20 according to an exemplary embodiment. FIG. 2 will be described in association with FIG. 1. Storage device 20 includes a memory array 34 for storing data. Memory array 34 may be an array of FLASH memory cells, for example. Storage device 20 also includes a memory controller 38 and a communication interface 36.

Memory controller 38 communicates with storage controller 14 via communication interface (I/F) 36 for providing (transmitting) operational information to storage controller 14 in response to an information request that storage device 20 receives from storage controller 14.

Figure 4:
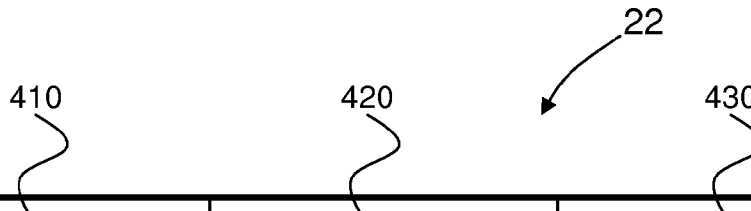
FIG. 4 shows a table stored on a storage controller according to an exemplary embodiment.

Operational information is stored in table 32 of memory array 34 (see FIG. 4). The operational information may include current consumption requirements for performing a given sub-operation. The operational information stored in table 32 is provided by storage device 20 to storage controller 14.

Figure 3:
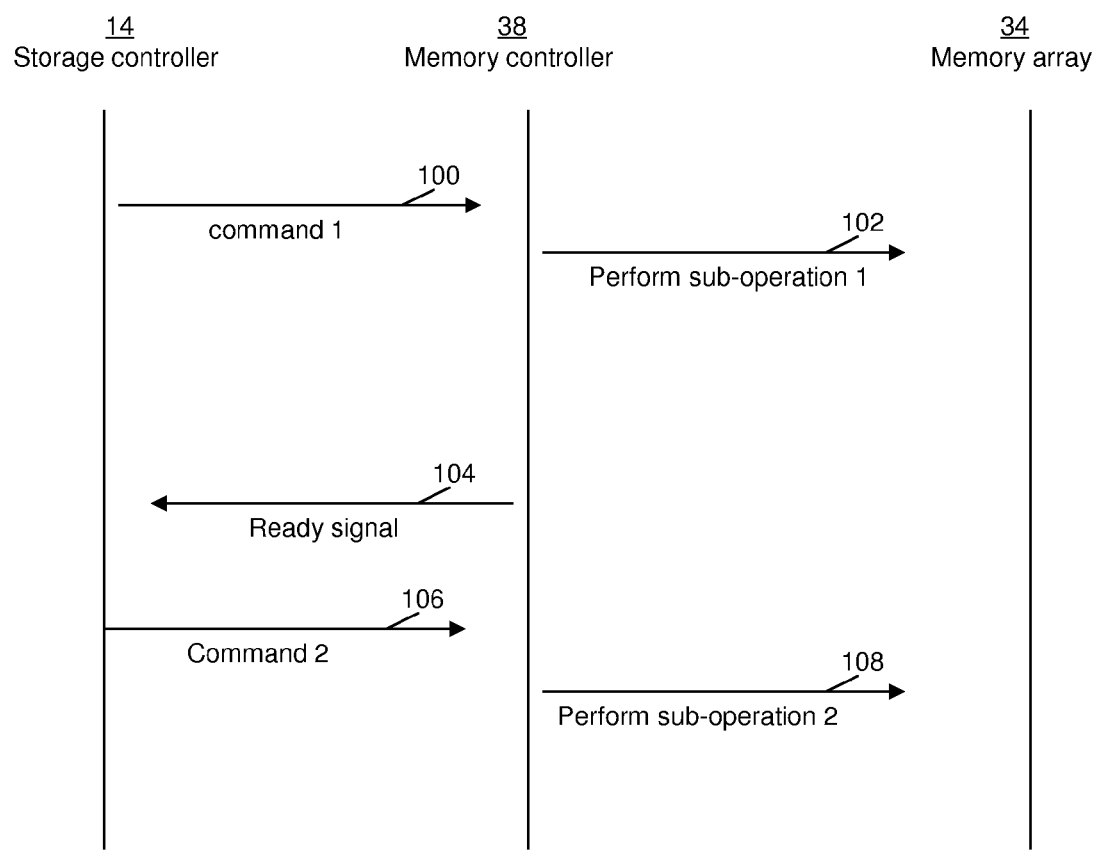
FIG. 3 demonstrates an interaction between a storage device and a storage controller according to an exemplary embodiment.

FIG. 3 schematically illustrates an interaction between a storage device and a storage controller of a storage system according to an exemplary embodiment. FIG. 3 will be described in association with FIGS. 1 and 2.

Memory controller 38 manages data transfers to and from memory array 34 based on commands that memory controller 38 receives from storage controller 14 of storage system 10. In other words, storage device 20 does not perform sub-operations automatically, in sequential order; but rather storage device 20 waits for storage controller 14 to send it a command before storage device 20 performs a sub-operation. Such a command indicates to memory controller 38 how to perform a particular sub-operation. Interaction between memory controller 38 and storage controller 14 may be as described below.

Memory controller 38 receives a first command (shown as "Command 1" at 100) from storage controller 14 to program data on non-volatile memory 34, for example. In response to receiving Command 1 memory controller 38 addresses non-volatile memory 34 (at 102) for performing a first sub-operation.

After the first sub-operation is performed on non-volatile memory 34 a Ready message is issued back from memory controller 38 to storage controller 14 (shown at 104). The "Ready" message indicates to storage controller 14 that storage device 20 has finished performing the sub-operation it was supposed to perform.

Then, in a similar manner to the first sub-operation, memory controller 38 receives a second command (shown as "Command 2" at 106) from storage controller 14 for performing a second sub-operation. In response to receiving Command 2, memory controller 38 addresses memory array 34 and performs the second sub-operation (shown at 108).

This process may continue for the next sub-operations until memory controller 38 manages operation of all the sub-operations of the requested program operation.

FIG. 4 shows a table 22 according to an exemplary embodiment. FIG. 4 will be described in association with FIG. 1. Table 22 includes field 410 for holding information for storage device SD1 that pertains to a 4-step (i.e., four sub-operations) programming operation; field 420 for holding similar information for storage device SD2, and field 430 for holding similar information for storage device SD3.

By way of example table 22 holds information for three storage devices (i.e., storage devices SD1, SD2, and SD3) but it may hold information for as many storage devices as necessary. The information held in table 22 specifies the way each sub-operation (e.g., of a program operation) is to be treated.

For the sake of the example it is assumed that storage controller 14 manages a program operation on storage devices SD1, SD2, and SD3 simultaneously. It is also assumed that completing each program operation requires performing or executing four sub-operations on each storage device. Performing a program operation may necessitate more than four sub-operations or fewer sub-operations. This may vary from one storage device technology to another and may further depend on the current consumption level consumed by the storage devices during each sub-operation, for example.

It is also assumed that the constraints of the maximum allowable current consumption level of storage system 10 are such that storage devices SD1, SD2, and SD3 are not permitted to simultaneously perform a program operation (or sub-operation) using more than sixteen "pipelines". That is, storage devices SD1, SD2, and SD3 are not permitted to program more than sixteen bits simultaneously. This is so because a program operation (or a program sub-operation) that uses sixteen pipelines may consume a higher current than a similar operation (or sub-operation) that uses eight pipelines or fewer pipelines. A pipeline is a path along which data is transferred within the central processing unit (storage controller 14, for example).

Referring to FIG. 4—at time t0 of a program operation, storage device SD1 is prompted by storage controller 14 to perform sub-operation 1 by using eight pipelines. That is, SD1 is prompted to program 8 bits simultaneously). Storage device SD2 is also prompted by storage controller 14 to perform sub-operation 1 by using eight pipelines. As explained above, the more pipelines are used in a programming operation, the higher is the current that is required for the programming operation. Therefore, with each of SD1 and SD2 using 8 pipelines operation of storage device SD3 is deferred for as long as SD1 and SD2 are handling their "8-piplenies" sub-operation 1.

At time t1 storage device SD1 is prompted to execute sub-operation 2 by using four pipelines. That is, SD1 is prompted to program 4 bits simultaneously. Storage device SD2 is also prompted to perform sub-operation 2 by using four pipelines. Therefore, with each of SD1 and SD2 using only 4 pipelines storage device SD3 is permitted by storage controller 14 to perform sub-operation 1 by using 8 pipelines.

At time t2 storage device SD2 is prompted by storage controller 14 to perform sub-operation 3 by using 8 pipelines; and storage device SD3 is prompted to perform sub-operation 2, also by using 8 pipelines. Operation of storage device SD1 is temporarily terminated by storage device controller 14 for as long as SD2 and SD3 are handling their "8-piplenies" sub-operations.

At time t3 storage device SD1 is prompted by storage controller 14 to execute sub-operation 3 by using 8 pipelines; storage device SD2 is prompted to perform sub-operation 4 by using 4 pipelines. Accordingly, storage device SD3 is permitted to use 4 pipelines to perform sub-operation 3.

At time t4 storage device SD1 is prompted by storage controller 14 to execute sub-operation 4 by using 8 pipelines; operation of storage device SD2 is terminated because SD2 has completed the 4-step program operation. Accordingly, storage device SD3 may now start performing sub-operation 4 by using 8 pipelines.

As mentioned above, other examples for parameters may be set to further enhance the way sub-operations are performed by the storage devices, including the number of bits simultaneously used (programmed) in a programming operation, the number of voltage steps that are used by the storage device in a programming operation (e.g., the more voltage steps are used in a programming operation, the more reliable is the execution of that operation), and/or the particular frequency of the clock that is used by the storage device in a particular operation.

FIG. 5 shows a table 32 for holding parameters according to an exemplary embodiment. In general, table 32 provides information pertaining to current consumption requirements associated with the performance of sub-operations (of sub-program operations, for example). In particular, table 32 includes field 510 for holding parameters; field 520 for indicating the time (in milliseconds) that sub-operations require for their completion, and field 530 for indicating the current that is consumed while the sub-operations are performed.

By way of example, table 32 provides current consumption information for performing sub-program operations that require using 2, 4, or 8 pipelines. As shown in FIG. 5 some sub-operations are performed at 30 MHz clock frequency while other sub-operations are performed at 40 MHz clock frequency.

Table 32 includes six exemplary entries where each entry refers to a different sub-program operation. For example, entry 540 refers to a sub-operation that includes programming data by using two pipelines and a clock frequency of 30 MHz. Given these conditions (i.e., using 2 pipelines and a clock frequency of 30 MHz) the sub-operation requires 200 milliseconds to complete and consumes 40 mA.

Entry 550 refers to a sub-operation that includes programming data by using four pipelines and a clock frequency of 30 MHz. Given these conditions (i.e., using 4 pipelines and a clock frequency of 30 MHz) the sub-operation requires 100 milliseconds to complete and consumes 80 mA. The difference between entries 540 and 550 implies that, using the same clock frequency, using four pipelines as opposed to two reduces to half the time it takes to complete the sub-operation, but doubles the resulting consumed current. Table 32 provides additional comparative information for other pipeline-clock frequency combinations.

Again, current consumption requirements for performing a sub-program operation are not limited to the exemplary parameters used herein, and may be based on other parameters, as discussed above.

Figure 6:
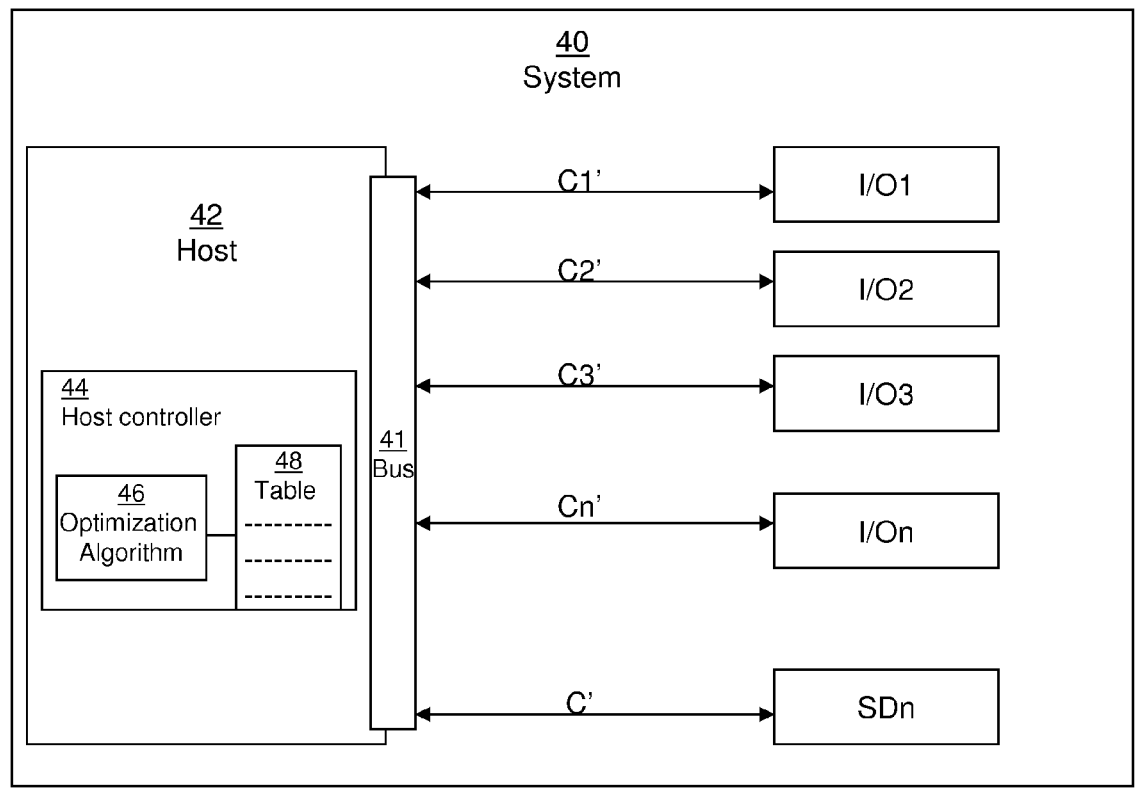
FIG. 6 is a block diagram of a system according to another exemplary embodiment.

FIG. 6 is a block diagram of a system 40 for managing operation of a plurality of devices according to another exemplary embodiment. System 40 includes a host 42 that is operationally connected to n Input-Output devices I/O1, I/O2, I/O3, ..., I/On and to a storage device (such as storage device SDn) over a common communication bus 41.

Host 42 includes a host controller 44 for managing operation of Input-Output devices I/O1, I/O2, I/O3, ..., I/On and operation of storage device SDn. Host controller 44 manages these devices over communication bus 41 and via data and control lines C1', C2', C3', ..., Cn' and C', respectively. Host controller 44 controls all the data transfer to/from Input-Output devices I/O1, I/O2, I/O3, ..., I/On and of storage device SDn and data transfer to/from host 42 by controlling, for example, "read", "write" and "erase" operations, wear leveling, and so on.

Input-Output devices I/O1 through I/On perform operations that include sub-operations, and report operational information to host controller 44.

In the context of this description, an "Input-Output device" or an "I/O device" refers to a device that is operable to transmit information to and to receive information from a host or from a host controller and to an external device that is operationally connectable to the host. An Input-Output device is fully compatible with the interface (i.e., communication bus 41) of host 42. Input-Output devices may be a dedicated non-removable device that is not removable from the storage system, or a removable device that is configured for removal from and addition to the storage system. Non-limiting examples for such Input-Output devices include GPS (Global Positioning System) devices, Wi-Fi (Wireless Fidelity) or Bluetooth adapters, Infa-Red adapters, Ethernet adapters, barcode readers, modems, radio tuners (such as FM radio tuners and TV tuners), Radio Frequency readers, and digital cameras among others.

Note that an Input-Output device may, but need not necessarily, be optionally directly, or indirectly, connected to one or more other Input-Output devices of the system, depending on the configuration.

In a similar manner to operation of the storage controller of FIG. 1, a basic control over the operation of I/O devices I/O1 through I/On and of storage device SDn is performed as follows: Input-Output devices I/O1 through I/On and SD1 interact with host 42 via common communication bus 41 prior to performing sub-operations of a variety of operations, such as storage operations. Hence, sub-operations are performed on Input-Output devices I/O1 through I/On and SD1 in response to and further based on a command from host controller 44. Such commands instruct the devices how to perform the designated sub-operation.

Host controller 44 communicates with each of I/O devices I/O1 through I/On and SDn for obtaining operational information from these devices.

Again, in order to facilitate operational management of I/O devices I/O1, I/O2, I/O3, ..., I/On and SDn by host controller 44, operational information is exchanged (either continually, occasionally, or intermittently between each of the I/O devices and SDn and host controller 44 using data and control lines C1', C2', C3', ..., Cn' and C respectively. Each of I/O devices I/O1 through I/On and SDn is uniquely identified to host controller 44, e.g., by using identifiers (e.g., identification numbers) that are arbitrarily assigned to these devices.

Data and control lines C1', C2', C3', ..., Cn' and C' may utilize any communication link known to those skilled in the art, including a USB connector into which a storage device is physically coupled, an optical port connection, an electrical port connection, a SATA (Serial Advanced Technology Attachment) port connection that is based on serial signaling technology, a PCI Express port connection, a FireWire port connection, an MMC memory card format port connection, an SD memory card format port connection, and a memory stick port connection among others. With the I/O devices I/O1 through I/On and SDn of the exemplary embodiments being in communication with the host over a conventional wired or wireless communication link, data and control lines C1', C2', C3', ..., Cn' and C can be a wired or wireless port.

Host controller 44 receives the operational information from the Input-Output devices I/O1 through I/On and employs an optimization algorithm 46; optimization algorithm 46 residing on the host controller 44 or being in connection with host controller 44. Optimization algorithm 46 is applied for setting parameters for sub-operations of an Input-Output device in a way that optimizes overall system performance. Setting parameters as such affects the way host controller 46 instructs an Input-Output device and/or storage device SDn to perform a given sub-operation.

These parameters are stored on a table of the host controller 44. For security considerations and other reasons, parameters stored on table 48 of host 42 can be concealed from users having access to the host.

Again, the parameters are set based on operational information pertaining to Input-Output devices I/O1 through I/On and SDn, and further based on and under limitation of the maximum allowable current consumption level of system 40. The maximum allowable current consumption level of the system 40 can be predefined on host controller 44, during manufacturing for example, or optionally determined by the host 42 during communicating with the Input-Output devices and SDn.

As an example is an Input-Output device being a navigation device, such as a GPS device having a receiver. A receiver is typically identified by its number of channels, which determine the number of satellites the receiver can monitor simultaneously. In such case, the operational information pertaining to this device for a particular sub-operation (e.g., activating the receiver) may include current consumption requirements for activating the receiver with either one, two, or all three channels simultaneously, Activating the receiver with a different number of channels causes the navigation device to consume different current levels; the more channels being used the higher the current consumption.

Again, the data management employed by the host controller 44 may factor in priority considerations.

For example, let's assume that Input-Output device I/O1 is a GPS device and that storage device SDn is used by a user mainly for navigation purposes. In such case, host 42 can set this GPS device a higher priority over all other Input-Output devices connected to it on common communication bus 41. As a result, I/O1 can be prompted to consume current more frequently than the other devices in system 40.

Figure 7:
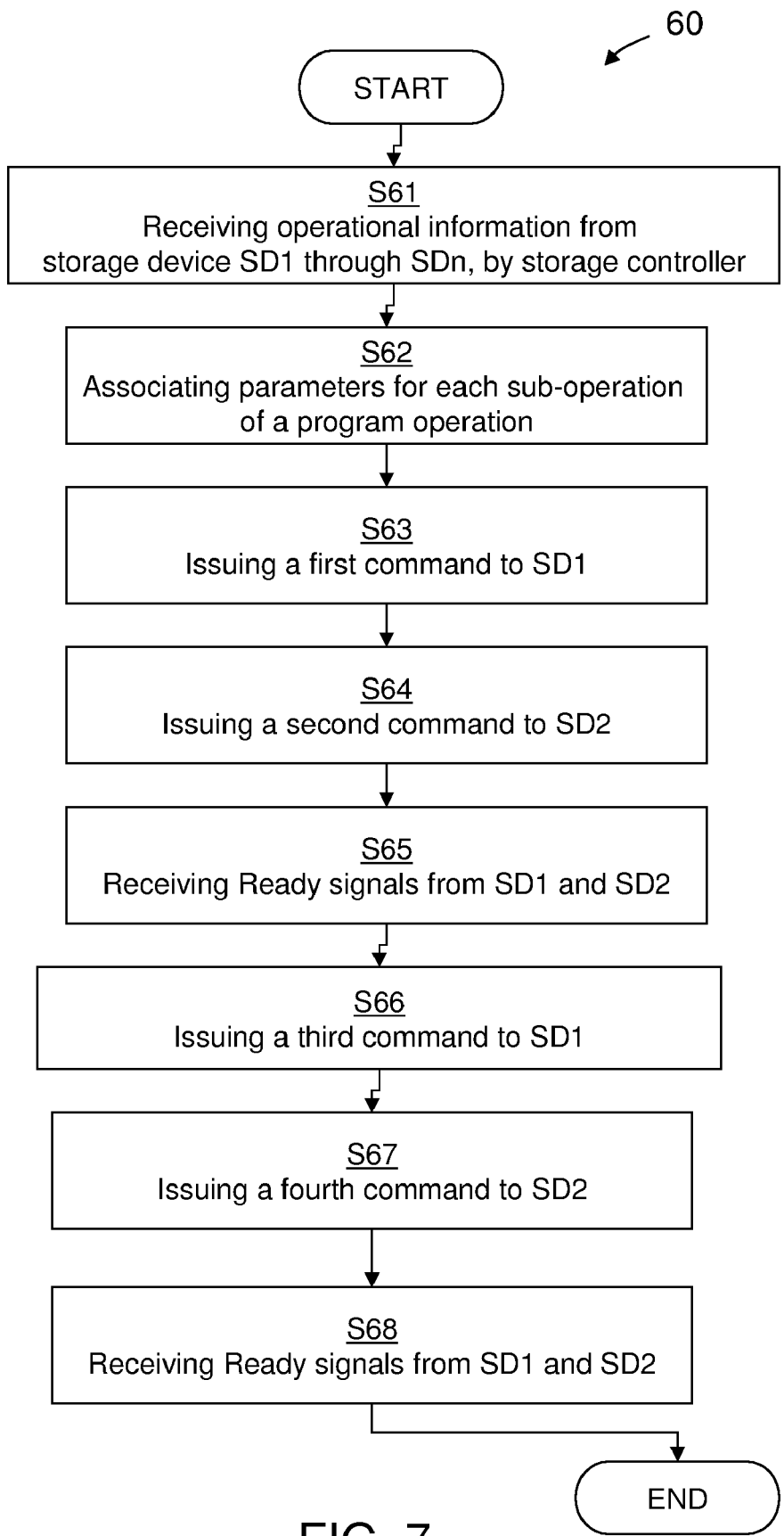
FIG. 7 shows a method by which the storage controller of FIG. 1 manages a plurality of storage devices.

FIG. 7 shows an example method by which storage controller 14 of FIG. 1 controls or manages a plurality of storage devices. FIG. 7 will be described in association with FIG. 1. The method depicted herein may be employed by a storage device such as storage controller 14 of storage system 10 for managing a program operation on storage devices SD1 through SDn. For the sake of the example, the method will be described using only storage devices SD1 and SD2. In addition, the program operation referred to in connection with this example is carried out by each of storage devices SD1 and SD2 via two sub-operations (sub-operation 0 and sub-operation 1, for example). In other words, the program operation performed by SD1 and SD2 requires, or involves using two sub-operations.

At step S61 storage controller 14 receives operational information from storage devices SD1 through SDn.

At step S62 storage controller 14 employs an optimization algorithm 12, which may reside, for example, on storage controller 14. As explained above, one of the tasks of optimization algorithm 12 is to associate parameters for each sub-operation of the program operation. Note that the parameters are associated with respect to the different storage devices in a way that optimizes overall system performance, in terms of obtaining optimal data transfer rate from the host to the memory array (or from the memory array to the host) under the limitation of the maximum allowable current consumption level of the storage system. Again, these parameters affect the way the storage devices perform sub-operations.

Then, storage controller 14 issues a first command to storage device SD1 (at step S63) and a second command to storage device SD2 (at step S64). The first command prompts SD1 to perform sub-operation 0 with a particular parameter that is selected for it. In this example the parameter selected for SD1 for executing sub-operation 0 is, "using eight pipelines and 30 MHz clock frequency". The second command prompts SD2 to perform sub-operation 0 by using a different parameter. In this example the parameter selected for SD2 for executing sub-operation 0 is "using sixteen pipelines and 30 MHz clock frequency.

Then, after storage controller 14 receives Ready messages or signals from storage devices SD1 and SD2 (at step S65), storage controller 14 issues a third command to storage device SD1 (at step S66) and a fourth command to storage device SD2 (at step S67). Storage controller 14 issues the third command for prompting SD1 to perform sub-operation 1 with a particular parameter (e.g., using 8 pipelines and 40 MHz clock frequency) and the fourth command for prompting SD2 to perform sub-operation 1 with a parameter selected thereto for this storage device (e.g., using 8 pipelines with 50 MHz clock frequency).

After corresponding Ready signals are received by storage controller 14 from both storage devices SD1 and SD2 (at step S68), the method comes to an end.

A device with which the storage system(s) is used may be any device known in the art that can directly connect to and communicate with a host. Such a device may be a dedicated device that is not removable from the storage system, or a device that is removable from the storage system.

Although the present disclosure refers to non-volatile storage devices, it may likewise be relevant to, or be used with, a volatile storage device. By way of example, non-volatile storage devices may be of the FLASH or EEPROM type.

The storage device used herein may be any storage device known in the art that is operative to connect directly to and communicate directly with a host. Such storage device may have a configuration that complies with a memory card format, including a secured digital memory card format and a multimedia card format. The storage device may include an array of memory cells (such as FLASH) having the capacity to store data in binary form in either a volatile or non-volatile manner. Note that having FLASH type memory cells is not meant as a limitation, as other embodiments using any appropriate type of memory cell are further applicable.

Memory cards are used with various electronic devices. Some memory cards are referred to as "embedded" cards and some memory cards are referred to as "removable" cards, which means that they can easily be moved by an end-user from one electronic device to another, thereby rendering the digital data stored in them portable data. The memory cards can have a relatively small form factor and can be used to store digital data for electronic devices that require data storage, such as digital cameras, media players/recorders (e.g., MP3 players), hand-held or notebook computers, personal digital assistants (PDAs), cellular phones, network cards, network appliances, set-top boxes, and hand-held or other devices.

Nonetheless, the present disclosure may employ any mass storage device, whether it is a removable storage device that is configured for connection to and removal from the storage system or a dedicated storage device that is embedded within a storage system.

Accordingly, the storage devices discussed herein may have a configuration that complies with any memory type (e.g. flash memory) and/or memory card format (e.g., a secured digital ("SD") memory card format) used for storing multimedia content such as audio, video, or picture files. The storage device may also have a configuration that complies with a multi media card ("MMC") format, a compact flash ("CF") format, a flash PC (e.g., ATA Flash) format, a smartmedia format, a USB flash drive, a memory stick format, or with any other industry standard format.

The storage device may have a non-volatile memory that retains its memory or stored state even when power is removed. The storage device may also employ an erasable programmable memory technology, e.g. an electrically-erasable and programmable read-only memory (EEPROM), EPROM, MRAM, FRAM ferroelectric, magnetic or other memory. Note that the device configuration does not depend on the type of memory, and may be implemented with any type of memory, be it a flash memory or another type of memory. The device may also be implemented with a memory chip and/or with three-dimensional (3D) memory chip technology.

The host discussed herein may be a personal computer, a notebook computer, a hand held computing device, such as a PDA (Personal Digital Assistant) or mobile handset, a cellular telephone, a camera, an audio reproducing device, or any other electronic device that work with removable data storage. A host may have various personal information management applications, such as an address book, a daily organizer, and electronic notepads, to name a few.

As will be appreciated by those familiar in the art, current devices employ a wide variety of different architectures and it is expected that new architectures will continue to be developed. In general, the exemplary embodiments may be employed in conjunction with a wide variety of different types and/or number of memory cards, so long as the card adapter being used has suitable interface connections and suitable processing power.

The embodiments, various examples of which are described herein, may be realized in hardware, software, firmware or any combination thereof. A typical combination of hardware and software could be a general purpose computer system with a computer program that, when being loaded and executed, controls the computer system such that it carries out the methods described herein. The concepts described above can also be embedded in a computer program product, which comprises all the features enabling the implementation of the embodiments described herein, and which, when loaded in a computer system is able to carry out these embodiments. Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

Having described the various embodiments of systems and a method, it is to be understood that the description is not meant as a limitation, since further modifications will now suggest themselves to those skilled in the art, and it is intended to cover such modifications as fall within the scope of the appended claims.

The invention claimed is:

1. A method of managing operation of a plurality of devices, the method comprising:
    receiving operational information that pertains to each of the plurality of devices, wherein each of the plurality of devices is configured to perform operations, the operations including sub-operations the operational information including at least one set of parameters for each sub-operation, wherein at least one of the sub-operations has at least two different sets of parameters, and wherein each set of parameters includes a current consumed parameter;
    receiving at least one sub-operation request requesting at least one sub-operation be performed by at least one of the plurality of devices; and
    managing operation of at least one of the plurality of devices, the operation management including selecting one set of parameters from the at least one set of parameters for each requested sub-operation, wherein the set of parameters is selected in a manner that ensures that a sum of the current consumed parameters of all requested sub-operations performed at any one time does not exceed a maximum allowable current consumption level.

2. The method of claim 1, wherein the set of parameters further includes at least one of: number of bits being simultaneously employed in a programming operation, number of voltage steps being used in a programming operation, and frequency of a clock being used in an operation.

3. The method of claim 1, wherein at least two sub-operations are requested to be performed at the same time, wherein the selecting of one set of parameters for each requested sub-operation includes causing a device to operate at a first operational state and causing at least one other device to operate at a second operational state, based on the operational information and on the maximum allowable current consumption level, wherein the second operational state corresponds to a command different from that represented by the first operational state.

4. The method of claim 1, wherein the operations for each of the plurality of devices includes programming of data onto the device, erasing of data from the device reading of data stored on the device, and a hold operation.

5. The method of claim 1, wherein the selecting of one set of parameters for each requested sub-operation is based also on a priority assigned to at least one of the plurality of devices.

6. The method of claim 1, wherein the selecting of one set of parameters for each requested sub-operation is based also on the content associated with an operation being performed on the at least one device on which the operation is being performed.

7. A method of managing operation of a device, the method comprising:
    providing operational information to a controller, by a device that is configured to perform operations including sub-operations, wherein the operational information includes at least one set of parameters for each sub-operation the device is configured to perform, wherein at least one sub-operation includes at least two different sets of parameters, and wherein each set of parameters includes a current consumed parameter; and
    performing, by the device, a given sub-operation based on a command received from the controller, wherein the command includes a selection of which set of parameters for the device to use while performing the sub-operation corresponding to the command, wherein the set of parameters is selected by the controller in a manner that ensures that the sum of the current consumed parameter corresponding to all commands concurrently performed across all devices controlled by the controller does not exceed a maximum allowable current consumption.

8. The method of claim 7, wherein the set of parameters includes at least one of: number of bits being simultaneously employed in a programming operation, number of voltage steps being used in a programming operation, and frequency of a clock being used in an operation.

9. A system comprising:
a plurality of devices, each of the plurality of devices being configured to perform operations, the operations including sub-operations, each sub-operation having at least one set of parameters, wherein the set of parameters includes a current consumed parameter and wherein at least one sub-operation has at least two different sets of parameters; and
a controller operationally connected to each of the plurality of devices, the controller being operative to manage operation of at least one of the plurality of devices, the operation management including selecting a set of parameters for a given sub-operation of a device such that the sum of all current consumed parameters for all sub-operations performed at any one time for all of the plurality of devices does not exceed a maximum allowable current consumption level of the system.

10. The system of claim 9, wherein at least one of the plurality of devices is a storage device.

11. The system of claim 9, wherein at least one of the plurality of devices is an input-output device.

12. The system of claim 9, wherein at least one of the plurality of devices is a storage device controller.

13. The system of claim 9, wherein at least one of the plurality of devices has a configuration in accordance with flash memory technology.

14. The system of claim 9, wherein at least two of the plurality of devices are the same and wherein the sets of parameters for each of the sub-operations for these at least two same devices are the identical.

15. The system of claim 9, wherein at least two of the plurality of devices are the same and wherein the sets of parameters for each of the sub-operations for these at least two same devices are the not identical.

16. A storage device operationally connected to a controller, the storage device comprising:
a storage portion configured to store data and to perform operations, the operations including sub-operations, each sub-operation having at least one set of parameters, wherein the set of parameters includes a current consumed parameter and wherein at least one sub-operation has at least two different sets of parameters; and
circuitry operative to manage operation of the storage portion, the operation management including providing operational information that pertains to the storage device to a controller, the operation information including the sets of parameters for each available sub-operation and performing a given sub-operation based on a command received from the controller, wherein the sub-operation is performed in accordance with a selected set of parameters selected by the controller from the at least one set of parameters for the given sub-operation, wherein the controller selects the selected set of parameters such that the sum of the current consumed parameters for all of the sub-operations performed at any one time across all of the storage devices controlled by the controller does not exceed a maximum allowable current consumption level.

17. A controller for managing a plurality of devices, the controller comprising:
circuitry operationally connected to a plurality of devices, each of the plurality of devices performing operations that include sub-operations, each sub-operation having at least one set of parameters, wherein the set of parameters includes a current consumed parameter and wherein at least one sub-operation has at least two different sets of parameters,
the circuitry being operative to manage operation of at least one of the plurality of devices, the operation management including selecting one set of parameters for a given sub-operation of a device such that the sum of all current consumed parameters for all sub-operations performed at any one time for all of the plurality of devices does not exceed based a maximum allowable current consumption level.

18. A system comprising:
a plurality of memory devices, each of the plurality of memory devices being configured to perform memory operations, the operations including sub-operations; and
a storage controller configured such that each of the plurality of memory devices is in direct communication with the storage controller,
with the storage controller being operative to manage operation of at least one of the plurality of storage devices, the operation management including associating parameters for a given sub-operation of a device based on 1) operational information that pertains to at least one of the plurality of storage devices and on 2) a maximum allowable current consumption level of the system.

* * * * *